(12) United States Patent
Chang et al.

(10) Patent No.: US 11,644,875 B2
(45) Date of Patent: May 9, 2023

(54) LOCK MECHANISM FOR SECURING AN EXPANSION CARD IN A COMPUTER CHASSIS

(71) Applicant: QUANTA COMPUTER INC., Taoyuan (TW)

(72) Inventors: Chun Chang, Taoyuan (TW); Ting-Kuang Pao, Taoyuan (TW); Yu-Syuan Lin, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 192 days.

(21) Appl. No.: 17/242,039

(22) Filed: Apr. 27, 2021

(65) Prior Publication Data
US 2022/0342462 A1 Oct. 27, 2022

(51) Int. Cl.
*G06F 1/18* (2006.01)
*H05K 5/02* (2006.01)

(52) U.S. Cl.
CPC ........... *G06F 1/185* (2013.01); *H05K 5/0221* (2013.01)

(58) Field of Classification Search
CPC .... G06F 1/185; H05K 5/0221; H05K 7/1487; H05K 7/1417
See application file for complete search history.

(56) References Cited

U.S. PATENT DOCUMENTS

| | | | | |
|---|---|---|---|---|
| 6,364,674 B1 * | 4/2002 | Kajiura | ................... | G06K 13/08 439/159 |
| 7,220,138 B2 * | 5/2007 | Miyamoto | ............. | G06K 13/08 439/159 |
| 7,484,976 B2 * | 2/2009 | Ezaki | ................. | G06K 13/0806 439/159 |
| 7,575,453 B2 * | 8/2009 | Lee | ...................... | G11B 33/121 439/351 |
| 7,628,653 B2 * | 12/2009 | Zhang | .................... | H01R 27/00 439/630 |
| 9,543,999 B2 * | 1/2017 | Kusuhara | ........... | H01R 13/2442 |
| 9,680,257 B2 * | 6/2017 | Nagase | ................ | G06K 13/085 |
| 10,312,634 B2 * | 6/2019 | Kim | ...................... | H01R 13/635 |
| 11,126,230 B1 * | 9/2021 | Chen | ...................... | G06F 1/181 |
| 2014/0273564 A1 * | 9/2014 | Matsumoto | ........ | G06K 13/0831 439/153 |

* cited by examiner

*Primary Examiner* — Bayan Salone
(74) *Attorney, Agent, or Firm* — Nixon Peabody LLP (57) ABSTRACT

A lock mechanism for securing an expansion card in a computer chassis includes an elongated structural support, a wedge, and a channel structure. The elongate structural support comprising a first and second arm extending obliquely away from each other from a central pivot point positioned between a first and second end of the elongate structural support. The wedge protrudes upwardly from the first arm at the first end of the elongated structural support. The wedge is configured to engage with a riser card component of a riser module including the expansion card and cause a rotation of the elongated structural support about the central pivot point from an unlocked to a locked position. The channel structure extends from the second arm at the second end of the elongated structural support. The channel structure is configured to secure the expansion card with the elongated structural support positioned in the locked position.

16 Claims, 9 Drawing Sheets

LOCK MECHANISM FOR SECURING AN EXPANSION CARD IN A COMPUTER CHASSIS

FIELD OF THE INVENTION

The present invention relates generally to a lock mechanism, and more specifically, to a lock mechanism for securing an expansion card in computer chassis.

BACKGROUND OF THE INVENTION

Expansion cards, such as peripheral component interconnect express (PCIe) cards, have common applications in computing systems, such as computing and input/output operations in a server. High quality connections between PCIe cards and servers are needed to allow for high performance operations during computing and input/output activities. To provide high quality signals between the server and the PCIe card, the PCIe card is assembled in a riser module to allow the PCIe card to remain physically steady and remain operable, when exposed to mechanical shock or vibrations. PCIe cards are typically constrained using a screw or latch mechanism. However, conventional constraining mechanisms can lead to the golden fingers on a PCIe card to wear prematurely at the riser module slot, causing signal loss from the PCIe card.

Accordingly, there is a need for improved mechanisms for securing an expansion card in a server to maintain a high quality connection between the expansion card and the server.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a lock mechanism for securing an expansion card in a computer chassis comprises an elongated structural support including a first arm and a second arm. The first arm and the second arm extend obliquely away from each other from a central pivot point positioned between a first end and a second end of the elongate structural support. A wedge protrudes upwardly from the first arm at the first end of the elongated structural support. The wedge is configured to engage with a riser card component of a riser module including the expansion card and cause a rotation of the elongated structural support about the pivot point from an unlocked position to a locked position. A channel structure extends from the second arm at the second end of the elongated structural support. The channel structure is configured to secure the expansion card with the elongated structural support positioned in the locked position.

In a further aspect of the implementation, the elongated structural support, wedge, and channel structure are a unitary one-piece structure. In a further aspect, the riser card and the expansion card are housed in a removable riser module. In yet a further aspect, a handle extends upwardly from the second arm near the second end. The handle is configured to allow manual rotation of the elongated support structure from the locked position to the unlocked position.

In a further aspect of the implementation, a top surface of the first arm and the second arm are generally aligned along the same horizontal plane. In a further aspect, a flexible arm extends downwardly from the second arm near the second end. In yet a further aspect, the flexible arm fully engages with a stopper plate of a supporting bracket for the elongated structural support when the elongated structural support is in the locked position.

In a further aspect of the implementation, the elongated structural support is secured to a cross-bar bracket at the pivot point. In a further aspect, the cross-bar bracket is fabricated from sheet metal. In yet a further aspect, the elongated structural support is a plastic material.

In a further aspect of the implementation, the second arm is approximately twice the length of the first arm. In a further aspect, the expansion card is a peripheral component interconnect express (PCIe) card.

According to certain aspects of the present disclosure, a method for securing an expansion card in a riser module to a computer chassis includes placing a riser module into the computer chassis. A riser card portion of the riser module is pushed against a wedge protruding upwardly from a first arm of an elongated structural support. The elongated structural support further includes a second arm. The first arm and the second arm extend obliquely from one another away from a central pivot point of the elongated structural support. In response to pushing the riser card portion against the wedge, the elongated structural support is caused to rotate in a first direction about the pivot point such that a channel structure extending from a second arm at the second end moves to a locked position to secure the expansion card to the computer chassis.

In a further aspect of the implementation, a handle positioned on the second arm of the elongated structural support is pulled to cause the elongated structural support to rotate about the pivot point in a second direction opposite the first direction. The channel structure moves to an unlocked position and the wedge pushes upwardly against the riser card portion to allow the riser module to be removed from the computer chassis.

In a further aspect of the implementation, the second arm is approximately twice the length of the first arm. In a further aspect, the expansion card is a PCIe card.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The present disclosure, and its advantages, will be better understood from the following description of representative embodiments together with reference to the accompanying drawings. These drawings depict only representative embodiments, and are therefore not to be considered as limitations on the scope of the various embodiments or claims.

DETAILED DESCRIPTION

A lock mechanism for securing an expansion card, such as a PCIe card, in a computer chassis, is described. The lock mechanism includes an elongated structural support, a wedge protruding upwardly from a first end of the elongated structural support, and a channel structure extending from a second end of the elongated structural support. The elongated structural support includes a first arm and a second arm that extend obliquely away from each other from a central pivot point positioned between the first end and the second end of the elongated structural support. The wedge can include a slanted contact surface configured to engage with a riser card component of a riser module including the expansion card and cause a rotation of the elongated structural support about the pivot point from an unlocked position to a locked position. The channel structure is configured to secure the expansion card with the elongated structural support positioned in the locked position. The lock mechanism is desirable for securing an expansion card into, for example, a server because the lock mechanism assists with maintaining a high quality connection between the expansion card and the server.

In some implementations, a method for securing an expansion card in a riser module to a computer chassis includes placing the riser module into the computer chassis. A riser card portion of the riser module is pushed against a wedge protruding upwardly from a first arm of an elongated structural support. The elongated structural support further includes a second arm where the first arm and the second arm extend obliquely from one another away from a central pivot point of the elongated structural support. In response to pushing the riser card portion against the wedge, the elongated structural support rotates in a first direction about the pivot point, such that a channel structure extending from a second arm at the second end moves to a locked position to secure the expansion card to the computer chassis.

The present disclosure provides improved flexibility and higher bandwidth for expansion cards, such as peripheral component interconnect express (PCIe) cards that are increasingly being used in computing devices, such as servers. The present disclosure provides an improved connection between the expansion card and the server by, for example, assembling the PCIe card in a riser cage that keeps the PCIe card secure and steady within the computing device, such that the PCIe card and the connection within the computing device can withstand mechanical shock and vibrations.

The present disclosure contemplates a rotatable lock mechanism fastened about a pivot point on a support bracketing. The rotatable lock mechanism is contemplated to automatically lock an expansion card during the assembly process of a computing device via slanting contact surfaces on a riser card and a wedge on the lock mechanism. In some implementations, the rotatable lock mechanism can also be rotated by the application of force during disassembly of a computing device. This provides an upward force on the riser card that allows the expansion card to be unlocked and removed.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

For the present disclosure, the terms "computer system" or "computer device" or "computing system" refer to any electronically-powered or battery-powered equipment that has hardware, software, and/or firmware components, where the software and/or firmware components can be configured for operating features on the device.

Turning now to FIGS. 1 to 4, top and bottom perspective views of a lock mechanism 110 and supporting bracket 120, along with cross-sectional views, are depicted. The lock mechanism 110 and the supporting bracket 120 are used for securing an expansion card (see element 540 in FIG. 5) to a computer chassis (see element 570 in FIG. 5). In some implementations, the expansion card 540 is a PCIe card.

The lock mechanism 110 includes an elongated structural support 115 having a first arm 117 and a second arm 119. The first arm 117 and the second arm 119 extend obliquely away from each other from a central pivot point 130 positioned between a first end 127 and a second end 129 of the elongate structural support 115. The elongated structural support 115 rotates about the pivot point 130 between a locked position and an unlocked position for an expansion card 540 (FIG. 5). In the locked position, the expansion card 540 is constrained by the lock mechanism 110, and in the unlocked position, the expansion card 540 (see FIG. 5) can be removed from the computer chassis 570 (see FIG. 5)

Figure 1:
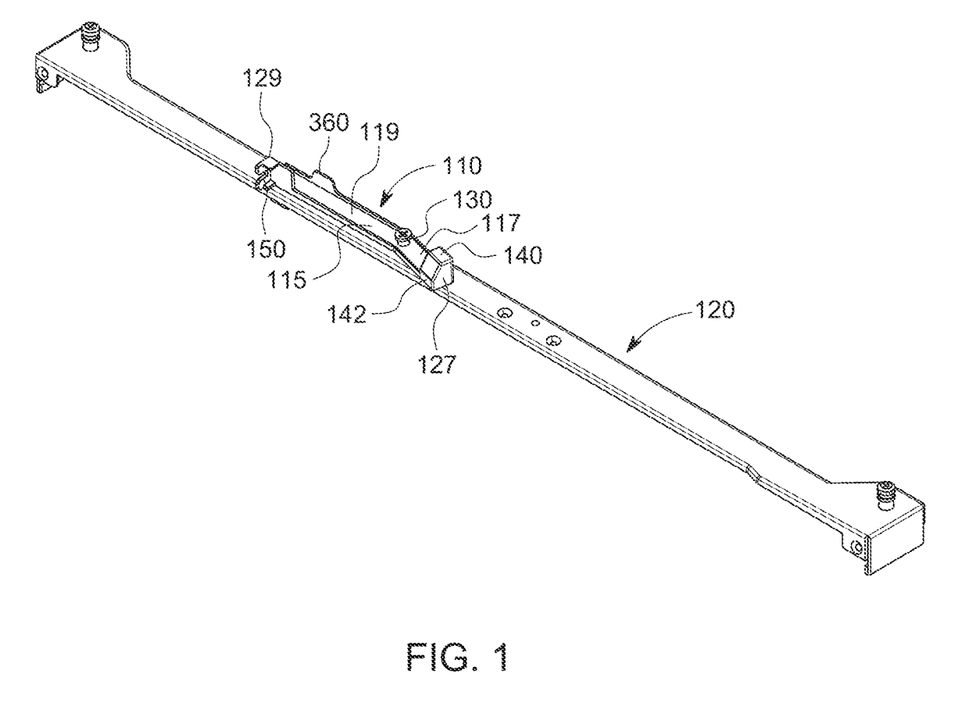
FIG. 1 is a top perspective view of a lock mechanism and supporting bracket for securing an expansion card to a computer chassis, according to some implementations of the present disclosure.

A wedge 140 protrudes upwardly from the first arm 117 at the first end 127 of the elongated structural support 115. The wedge 140 is configured to engage with a riser card component 550 (see FIG. 5) of a riser module 560 (see FIG. 5). In some implementations, the riser module 560 includes the expansion card 540 (see FIG. 5).

During an assembly process of a computing device, a slanted contact surface 142 of the wedge 140 is engaged by the riser card 550 (FIG. 5) following the application of a downward force to the riser card 550. The engagement causes the riser card 550 to touch a slanted contact surface 142, which causes the elongated structural support 115 to rotate about the pivot point 130 in direction A (see FIG. 3) from an unlocked position to a locked position (see FIGS. 11 and 12). Belatedly, during a disassembly process of a computing device, the riser card 550 (FIG. 5) is engaged via an upward force applied by the wedge 140, causing the elongate structural support 115 to rotate in an opposite direction B (see FIG. 3) about the pivot point 130 from the locked position to the unlocked position.

A channel structure 150 with a slot 155 (see FIG. 3) extends from the second arm 119 at the second end 129 of the elongated structural support 115. The slot 155 of the channel structure 150 engages with the expansion card 540 (see FIG. 5) as the elongated structural support 115 is rotated into the locked position. In addition to horizontally constraining the expansion card 540 (FIG. 5), the channel structure 150 via the slot 155 can further constrain the expansion card 540 from vertical movements.

The elongated structural support 115 is secured to a support bracket 120 such as, but not limited to, a cross-bar bracket, at the central pivot point 130 using, for example, a screw, pin, or a similar mechanical fastener. In some implementations, the support bracket 120 is fabricated from sheet metal. In some implementations, the elongated structural support 115, the wedge 140, and the channel structure 150 are all fabricated from a plastic material and may be formed or molded as a unitary one-piece structure.

Figure 2:
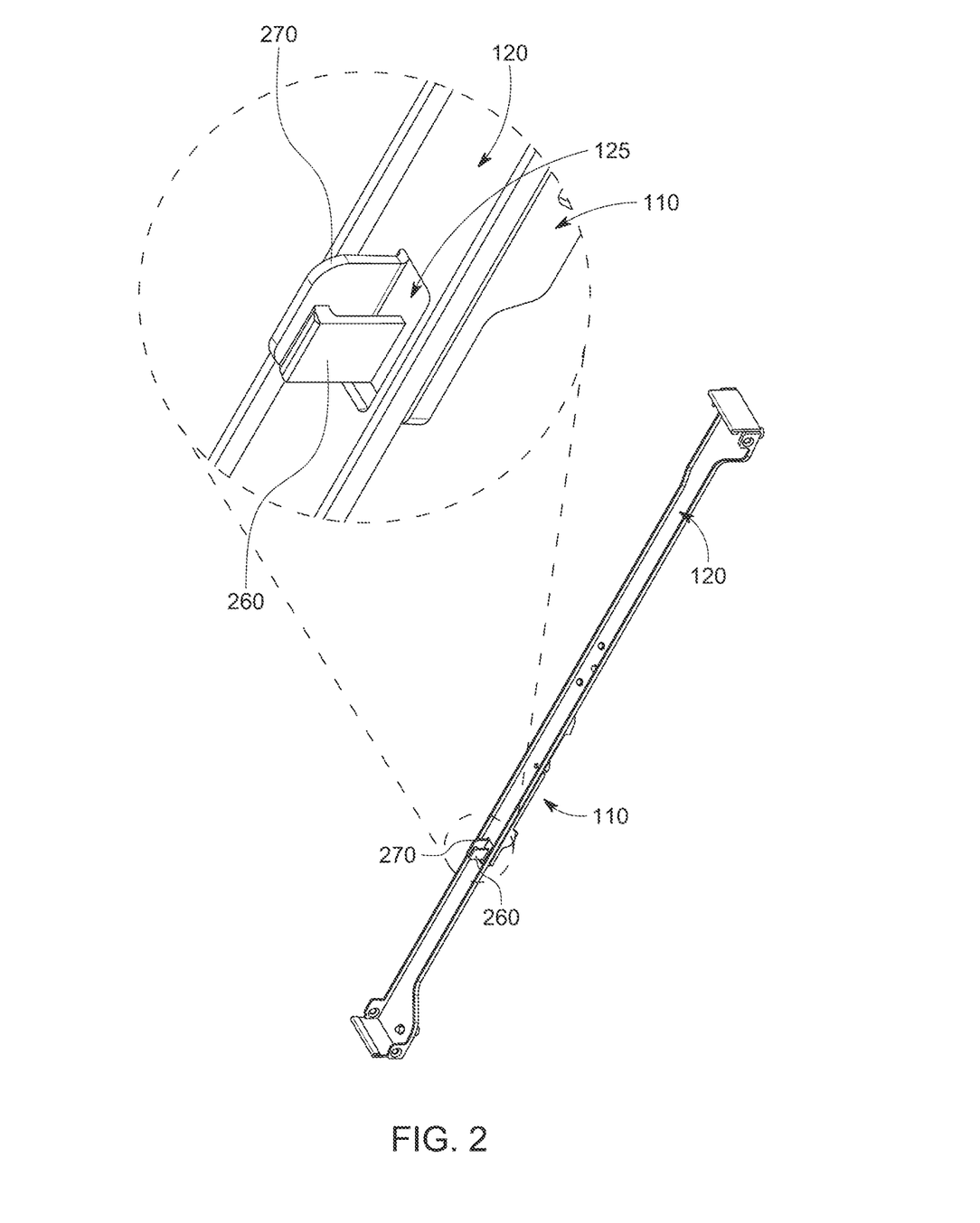
FIG. 2 is a bottom perspective view of the lock mechanism and supporting bracket in FIG. 1, according to some implementations of the present disclosure.
Figure 3:
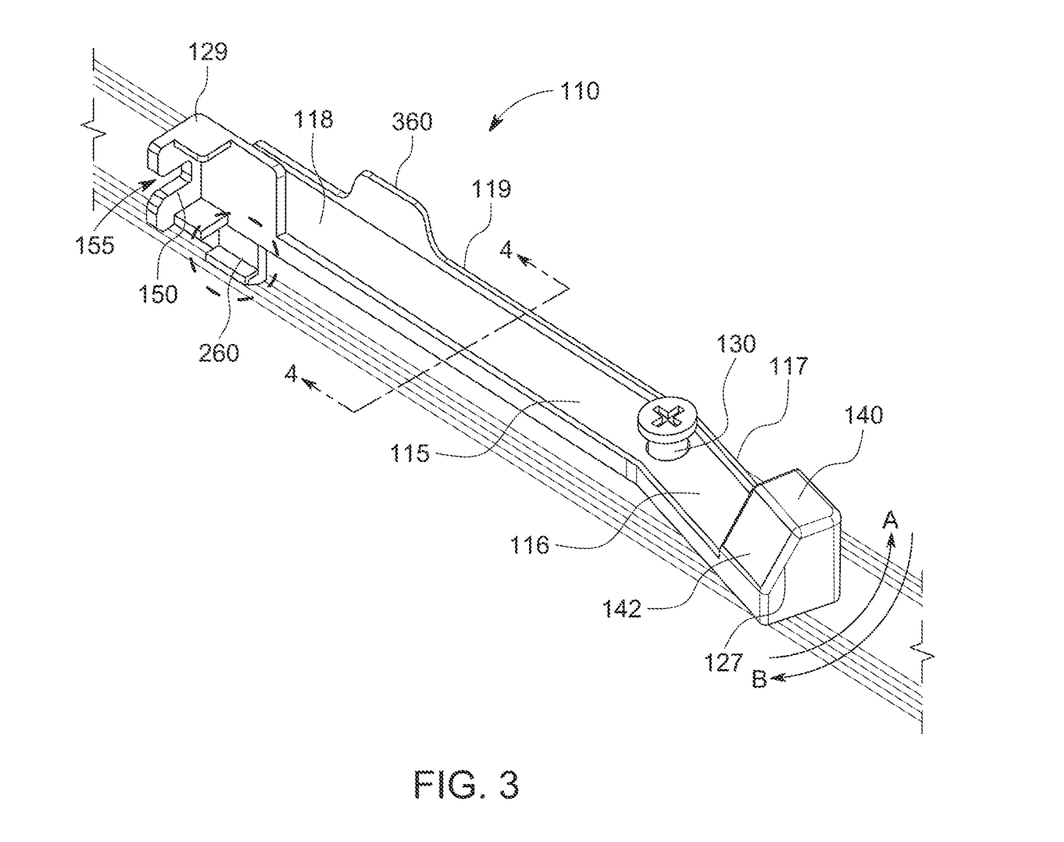
FIG. 3 is a close-up of the top perspective view of the lock mechanism in FIGS. 1 and 2, according to some implementations of the present disclosure.

In FIG. 2, a bottom perspective view of the lock mechanism 110 and supporting bracket 120 are depicted, including a flexible thin 260 that extends through an aperture 125 in the support bracket 120 near the second end 129 of the second arm 119. The flexible arm 260 provides a moment force in direction B (see FIG. 3) to the elongated structural support 115 resulting from the flexible arm 260 interfacing with a stopper plate 270. The interfacing of the flexible arm 260 with the stopper plate 270 allows for the contact surface 142 of the wedge 140 to maintain a locked position absent a counter external force applied to handle 360 for moving the elongated structural support 115 to an unlocked position. When the elongated structural support 115 is in the unlocked position, the riser module 560, including the expansion card 540 (FIG. 5), can be removed or dissembled from a computer chassis 570 (FIG. 5). In some implementations, the flexible arm 260 fully engages with the stopper plate 270 of the supporting bracket 120 when the elongated structural support 115 is rotated in direction A (FIG. 3) into the locked position.

in FIG. 3, the elongated structural support 115, wedge 140, and channel structure 150 are depicted as a unitary one-piece structure. The handle 360 extends upwardly from the second arm 119 near the second end 129. The handle 360 allows for an external force to be applied (e.g., manual force) to rotate the elongated support structure 115 from the locked position to the unlocked position.

In some implementations, a top surface 116 of the first arm 117 and a top surface 118 of the second arm 119 are generally aligned along the same horizontal plane as is depicted in FIG. 3 to form an even continuous surface. In some implementations, the top surfaces 116, 118 may be uneven.

In some implementation, the length along the long axis of the second arm 119 is approximately twice the length or longer than the length along the long axis of the first arm 117. The length differential can be beneficial to allow for a decreased release force needed to be applied to handle 360 when moving the elongated structural support 115 from a locked position to an unlocked position.

Figure 4:
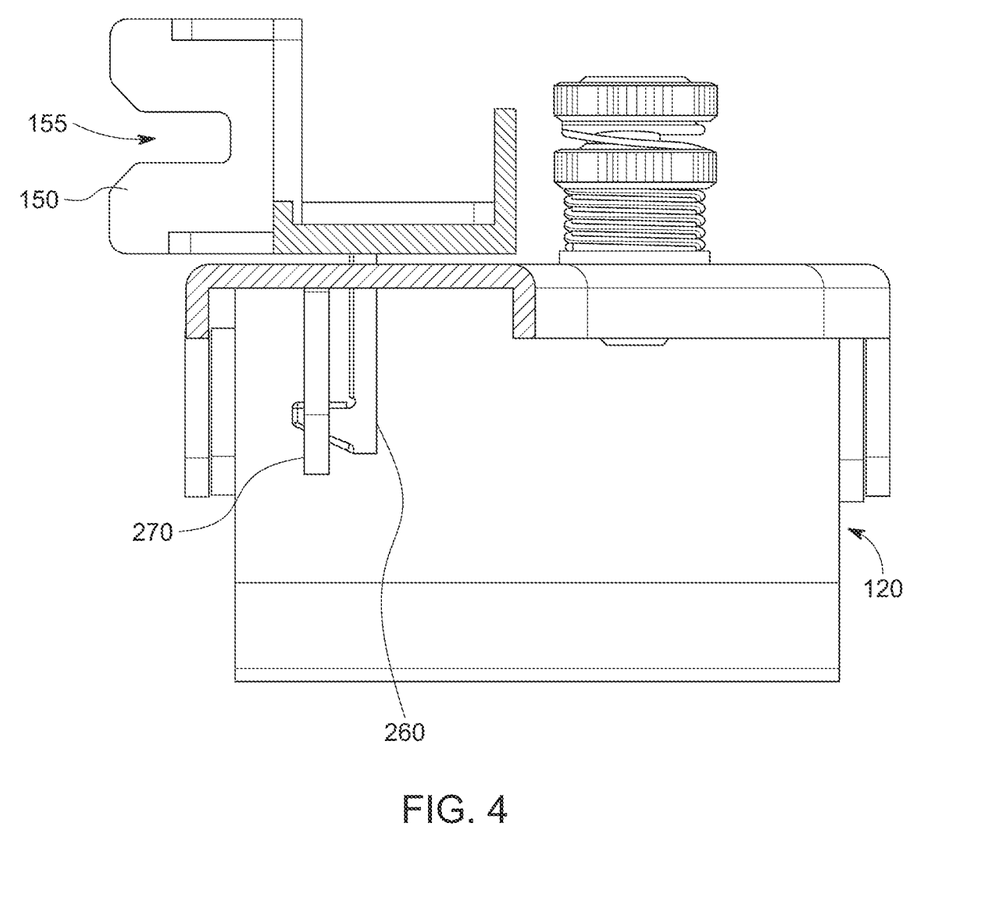
FIG. 4 is cross-sectional view through the lock mechanism and supporting bracket of FIGS. 1 to 3, according to some implementations of the present disclosure.
Figure 5:
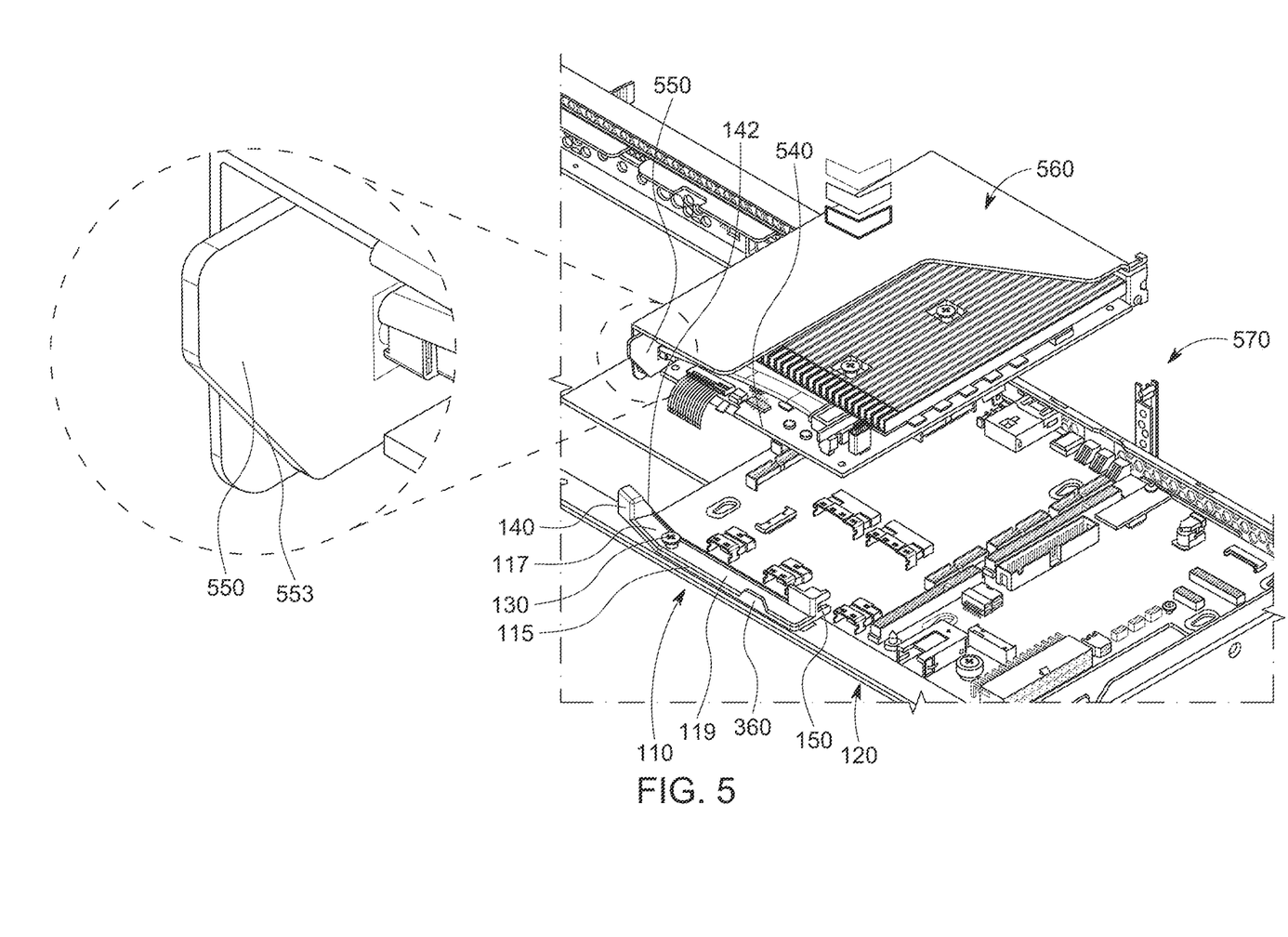
FIG. 5 is a top perspective view depicting the lowering of a riser module with an expansion card and riser card into a computer chassis, according to some implementations of the present disclosure.

In FIG. 4, a cross-sectional view through the lock mechanism 110 and supporting bracket 120 of FIGS. 1 to 3 is depicted. A close-up of the flexible arm 260 depicts the engagement of the downwardly-extending flexible arm 260 with the stopper plate 270. The flexible arm 260 fully engages with the stopper plate 270 when the elongated structural support 115 is in the locked position, where an expansion card 540 (see FIG. 5) is constrained in slot 155 of channel structure 150.

Figure 6:
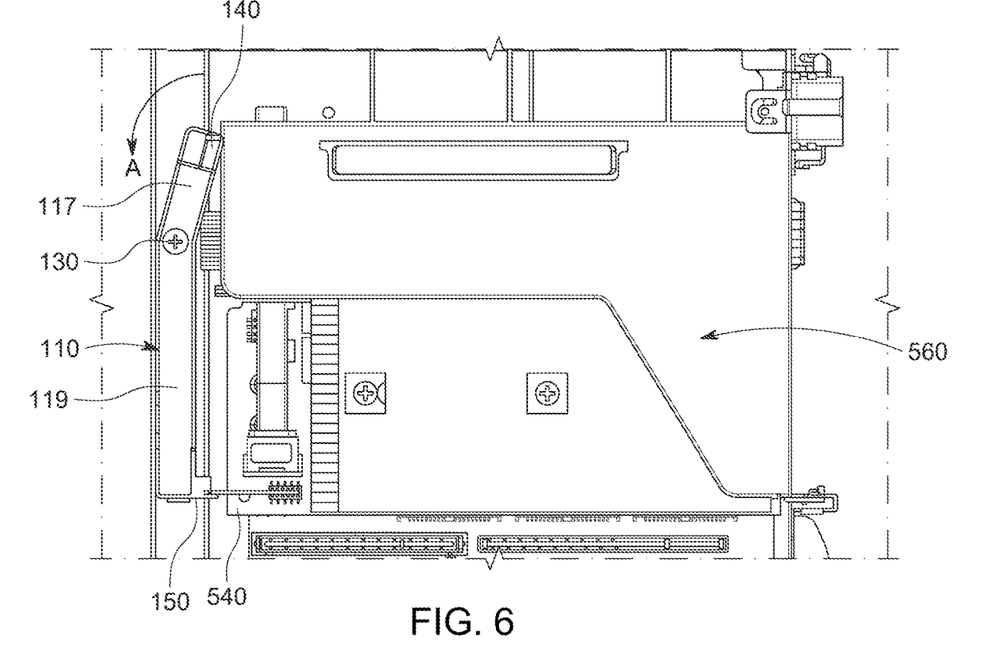
FIG. 6 is a top view of the riser module in FIG. 5 during placement into the computer chassis, according to some implementations of the present disclosure.
Figure 7:
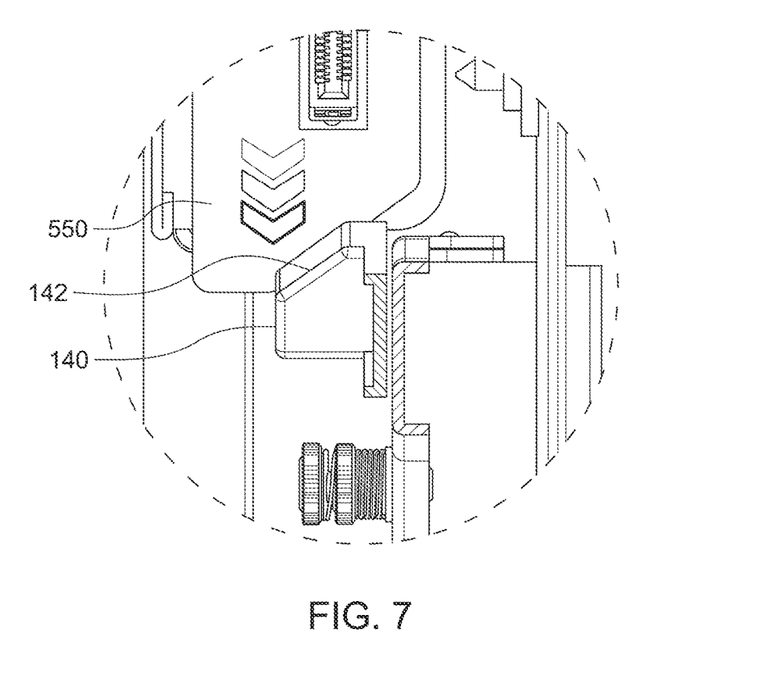
FIG. 7 is a side view of the riser card in the riser module of FIG. 5 engaging with a wedge protruding from the elongated structural support to initiate a rotation of the elongated structural support, according to some implementations of the present disclosure.

Turning now to FIGS. 5 to 7, perspective and top views, along with a side view of the riser module 560, are depicted during placement of the riser module 560, that houses an expansion card 540 and riser card 550, into a computer chassis 570. During the lowering of the riser module 560 into the computer chassis 570, a sloped edge 553 of the riser card 550 is placed in contact with a slanted contact surface 142 of a wedge 140 protruding upwardly from a first arm 117 of an elongated structural support 115. The first arm 117 and a second arm 119 of the elongated structural support 115 extend obliquely from one another away from a central pivot point 130. As the sloped edge 553 of the riser card 550 is pushed against the slanted surface 142 of the wedge 140, the elongated structural support 115 is rotated in a first direction A (see FIG. 6) about the central pivot point 130, such that a channel structure 150 extending from a second arm 119 at the second end 120 moves to a locked position (see FIGS. 6 to 10) to secure the expansion card 540 to the computer chassis 570. Initiation of the rotation of the elongated structural support 115 towards the locked position is depicted in FIG. 7, which shows a side view of the riser card 550 in the riser module 560 of FIG. 5 engaging with the slanted contact surface 142 of wedge 140.

Figure 8:
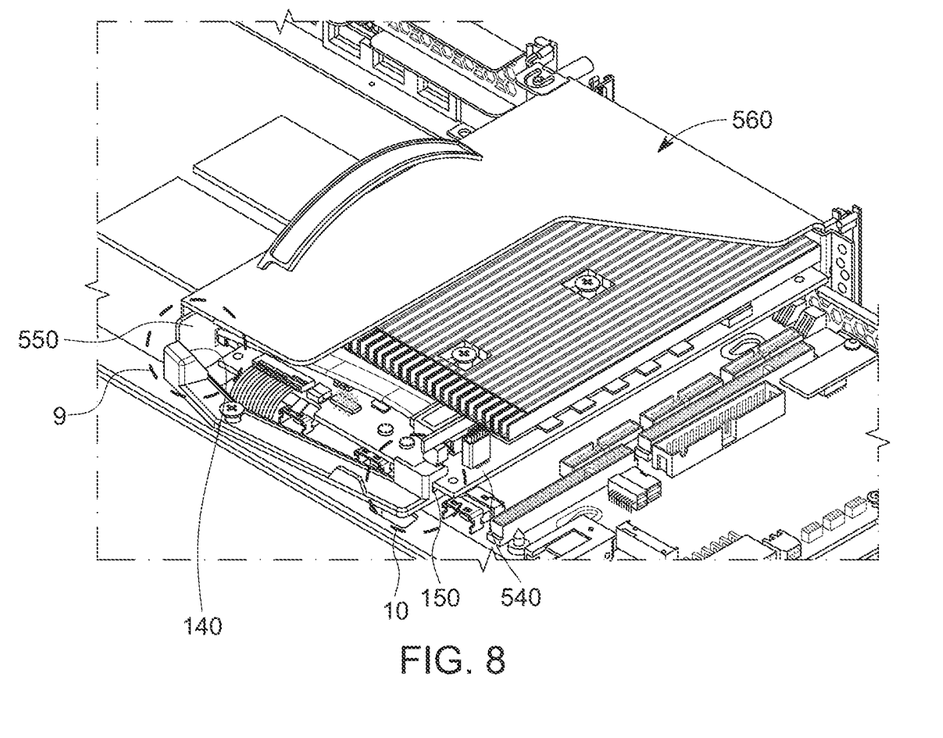
FIG. 8 is a top perspective view of the riser module of FIG. 5 after placement into the computer chassis with a channel structure extending from the elongated structural support to secure the expansion card in a locked position, according to some implementations of the present disclosure.
Figure 9:
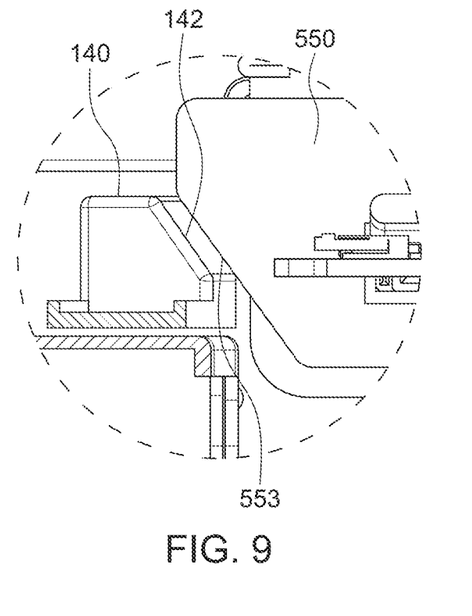
FIG. 9 is a side view of the riser card of FIG. 8 with the elongated structural support in the locked position, according to some implementations of the present disclosure.
Figure 10:
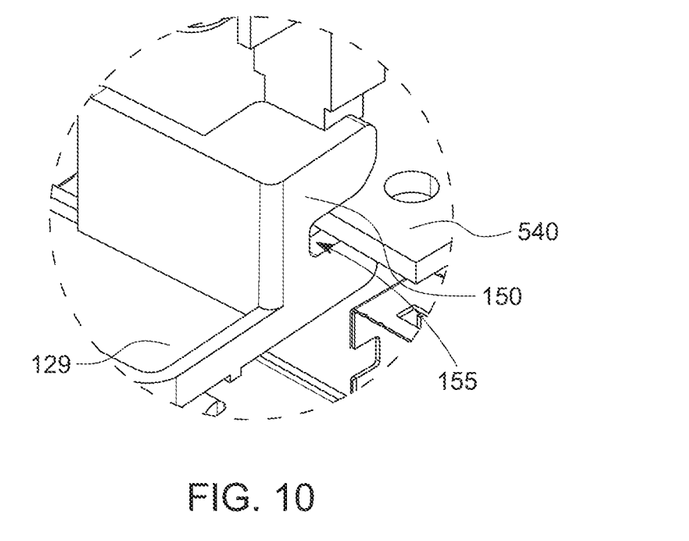
FIG. 10 is a perspective view of the channel structure of FIG. 8 securing the expansion card in a locked position, according to some implementations of the present disclosure.

Turning now to FIGS. 8 to 10, top and side perspective views of the riser module 560 of FIG. 5, after being lowered into the computer chassis 570, are depicted including close-ups of the riser module 560 engaging with the wedge 140 and the channel structure 150 of the elongated structural support 115. The expansion card 540 and the riser card 500 are housed in the removable riser module 560. The slot 155 of the channel structure 150 constrains the expansion card 540, such as a PCIe card, in a locked position, following rotation of the elongated structural support 115 into the locked position.

Figure 11:
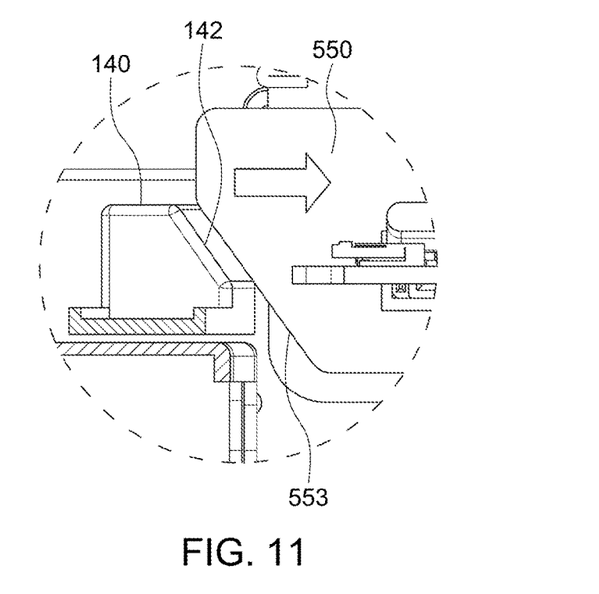
FIG. 11 is a side view of the riser card of FIG. 8 with the elongated structural support transitioning to an unlocked position, according to some implementations of the present disclosure.
Figure 12:
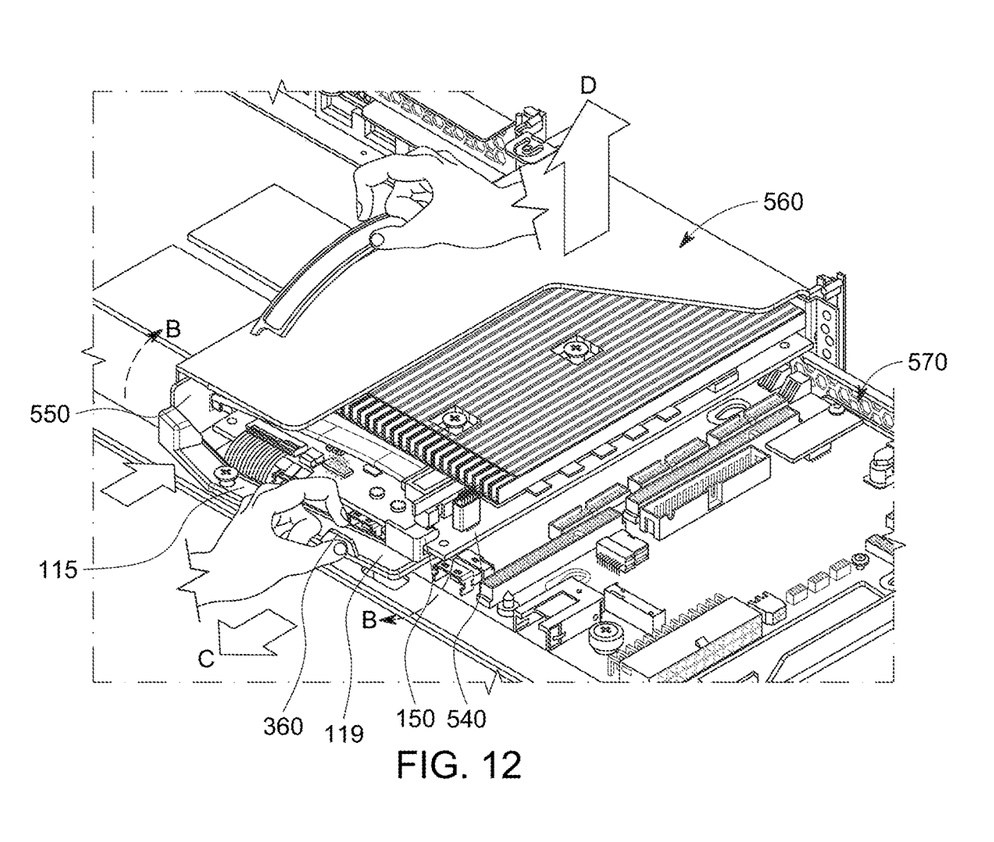
FIG. 12 is a perspective view of the riser module of FIG. 5 transitioning to an unlocked position, according to some implementations of the present disclosure.

Referring to FIGS. 11 and 12, side and perspective views of the riser card 550 and riser module 560 of FIGS. 5 and 8, are depicted, with the elongated structural support 115 transitioning to an unlocked position. A handle 360, extending from the second arm 119 of the elongated structural support 115, has a force applied to it in a direction C that causes the elongated structural support 115 to rotate about the pivot point 130 in a direction B (see FIG. 12) that is opposite the direction A (see FIG. 6) toward the locking position. The channel structure 150 moves to an unlocked position and the slanted contact surface 142 of the wedge 140 pushes upwardly against the sloped edge 553 of the riser card 550 to allow the riser module 560 to be lifted in a direction D out of the computer chassis 570.

The implementations described above for FIGS. 1 to 12 are primarily in the context of an expansion card in a riser module being secured into a computer chassis of a computing device. However, the described lock mechanism and method for securing an expansion card are applicable to other riser modules and expansion cards for a computing device. The described lock mechanism and method for securing an expansion card have been presented by way of example only, and not limitation, and can include different combinations of the described elements.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A lock mechanism for securing an expansion card in a computer chassis, the lock mechanism comprising:
   an elongated structural support comprising a first arm and a second arm extending obliquely away from each other from a central pivot point positioned between a first end and a second end of the elongated structural support;
   a wedge protruding upwardly from the first arm at the first end of the elongated structural support, the wedge configured to engage with a riser card component of a riser module including the expansion card and cause a rotation of the elongated structural support about the central pivot point from an unlocked position to a locked position; and
   a channel structure extending from the second arm at the second end of the elongated structural support, the channel structure configured to secure the expansion card with the elongated structural support positioned in the locked position.

2. The lock mechanism of claim 1, wherein the elongated structural support, the wedge, and the channel structure are a unitary one-piece structure.

3. The lock mechanism of claim 1, wherein the riser card and the expansion card are housed in a removable riser module.

4. The lock mechanism of claim 1, further comprising a vertical handle extending upwardly from the second arm near the second end, the vertical handle configured to allow manual rotation of the elongated support structure from the locked position to the unlocked position.

5. The lock mechanism of claim 1, wherein top surfaces of the first arm and the second arm are generally aligned along the same horizontal plane.

6. The lock mechanism of claim 1, further comprising a flexible arm extending downwardly from the second arm near the second end.

7. The lock mechanism of claim 6, wherein the flexible arm fully engages with a stopper plate of a supporting bracket for the elongated structural support when the elongated structural support is in the locked position.

8. The lock mechanism of claim 1, wherein the elongated structural support is secured to a cross-bar bracket at the central pivot point.

9. The lock mechanism of claim 8, wherein the cross-bar bracket is fabricated from sheet metal.

10. The lock mechanism of claim 1, wherein the elongated structural support is a plastic material.

11. The lock mechanism of claim 1, wherein the second arm has a length equal to approximately twice the length of the first arm.

12. The lock mechanism of claim 1, wherein the expansion card is a peripheral component interconnect express (PCIe) card.

13. A method for securing an expansion card in a riser module to a computer chassis, the method comprising:
   placing a riser module into the computer chassis;
   pushing a riser card portion of the riser module against a wedge protruding upwardly from a first arm of an elongated structural support, the elongated structural support further comprising a second arm, the first arm and the second arm extending obliquely from one another away from a central pivot point of the elongated structural support;

in response to pushing the riser card portion against the wedge, causing the elongated structural support to rotate in a first direction about the central pivot point such that a channel structure extending from a second arm at the second end moves to a locked position, thereby securing the expansion card to the computer chassis.

14. The method of claim 13, further comprising pulling a vertical handle positioned on the second arm of the elongated structural support to cause the elongated structural support to rotate about the central pivot point in a second direction opposite the first direction such that the channel structure moves to an unlocked position and the wedge pushes upwardly against the riser card portion to allow the riser module to be removed from the computer chassis.

15. The method of claim 13, wherein the second arm has a length equal to approximately twice the length of the first arm.

16. The method of claim 13, wherein the expansion card is a PCIe card.

* * * * *